US011073540B2

(12) United States Patent
Bemat et al.

(10) Patent No.: US 11,073,540 B2
(45) Date of Patent: Jul. 27, 2021

(54) LOAD DISPARITY DETECTION

(71) Applicant: Hewlett Packard Enterprise Development LP, Houston, TX (US)

(72) Inventors: Mohamed Amin Bemat, Cypress, TX (US); Thi Vu, Houston, TX (US); Kirk Yates, Sacramento, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 251 days.

(21) Appl. No.: 15/960,708

(22) Filed: Apr. 24, 2018

(65) Prior Publication Data
US 2019/0324067 A1 Oct. 24, 2019

(51) Int. Cl.
*G01R 19/25* (2006.01)
*G05F 1/59* (2006.01)
*G01R 19/10* (2006.01)
*G06F 1/30* (2006.01)
*G06F 1/28* (2006.01)

(52) U.S. Cl.
CPC ......... *G01R 19/2513* (2013.01); *G01R 19/10* (2013.01); *G05F 1/59* (2013.01); *G06F 1/28* (2013.01); *G06F 1/305* (2013.01)

(58) Field of Classification Search
CPC ............ G05F 1/59; G01R 19/10; G06F 1/305
See application file for complete search history.

(56) References Cited

U.S. PATENT DOCUMENTS

| 9,459,304 | B1 * | 10/2016 | Parkin | G01R 31/52 |
|---|---|---|---|---|
| 2007/0035978 | A1 * | 2/2007 | Newman, Jr. | H02M 5/32 363/148 |
| 2010/0274893 | A1 | 10/2010 | Abdelal et al. | |
| 2013/0297256 | A1 | 11/2013 | Yang | |
| 2015/0333657 | A1 * | 11/2015 | Allert | H02J 3/34 307/18 |
| 2016/0091397 | A1 | 3/2016 | Shinkle et al. | |

FOREIGN PATENT DOCUMENTS

EP   1928007   6/2008

OTHER PUBLICATIONS

Salfner, F. et al.; "A Survey of Online Failure Prediction Methods"; 2010; 68 pages.

* cited by examiner

*Primary Examiner* — Alvaro E Fortich
(74) *Attorney, Agent, or Firm* — Brooks, Cameron & Huebsch, PLLC

(57) ABSTRACT

In some examples, a controller may include a processing resource and a memory resource storing machine readable instructions executable to cause the processing resource to set an electrical power threshold, monitor an amount of electrical power distributed between a plurality of phases of a multi-phase converter operation. The controller may detect a load disparity between a particular phase of the plurality of phases, disable the particular phase, and redistribute the electrical power amongst the remaining phases of the multi-phase converter operation.

20 Claims, 4 Drawing Sheets

LOAD DISPARITY DETECTION

BACKGROUND

Electric power balancing includes adjusting an allocation of power between multiple phases to adjust resource use, throughput, and response time, among others. A device can be supplied power by distributing the total electrical power between multiple phases such that each phase may carry approximately the same amount of electric power to the device.

DETAILED DESCRIPTION

Figure 1:
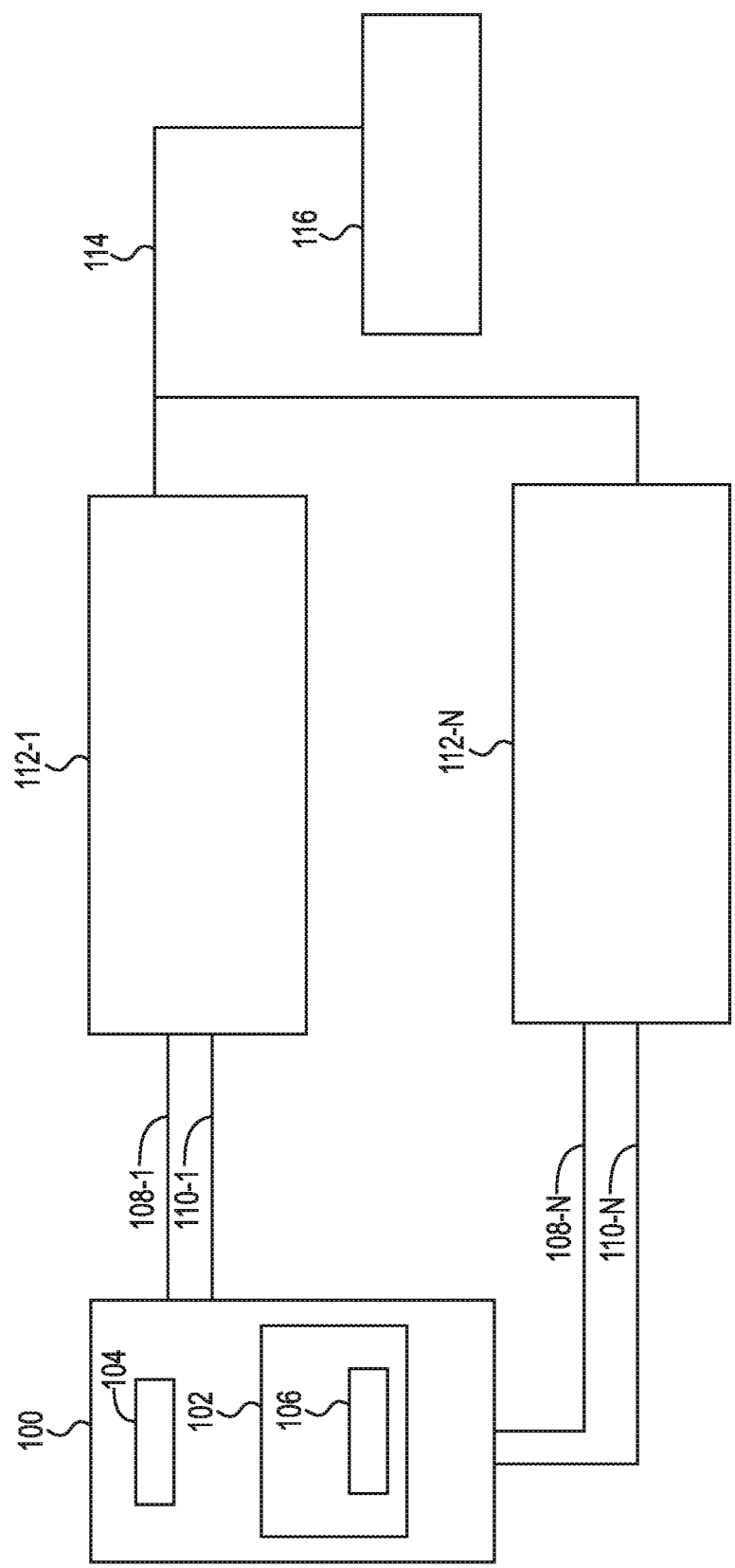
FIG. 1 illustrates an example controller connected in a multi-phase converter operation consistent with the present disclosure.

A multi-phase power converter operation manages allocation of power provided to balance an amount of electric power between multiple phases such that each phase carries (e.g., delivers) approximately the same amount of electric current to power a device. As used herein, the term "power" means electric power which may be in the form of volts and/or current which may provide electricity to a device to carry out functions of said device. As used herein, the term "phase" means that the power supplied is offset by a period of time. For example, a three-phase system may have three conductors providing voltages that are offset in time by one-third the time-period. A load disparity indicates that the phases are not balanced. When the multi-phase converter operation is not balanced, the multi-phase converter operation may become unreliable. Electrical power may be supplied to operate a device, and/or multiple devices. The electrical power supplied may be distributed in alternating current to multiple phases. The electrical power may be distributed among the multiple phases such that no one phase carries a larger portion of the total electrical power balanced between the multiple phases. A load disparity between the phases in a multi-phase converter operation may indicate that a phase is damaged (e.g., faulty), and the damaged phase should be stopped from contributing electrical power in the multiphase converter operation to prevent damage and/or failure of the device(s) being powered.

A multi-phase power management operation may be utilized with computing devices. As used herein, the term "computing device" or "computing system", means a machine to perform data analysis, computations, or otherwise perform information processing and/or otherwise control the operation of another machine. A multi-phase converter operation may be utilized in a computing device such as a server. A server may be powered by an external power supply that is distributed amongst multiple phases to power multiple devices (e.g., CPU, Memory, ASIC etc.). As used herein, the term "distributed" means that the amount of electrical power may be divided and allocated to each phase of a multi-phase converter operation. The server may include a controller to distribute the power to multiple phases. As used herein, a "controller" means a component of computer hardware that may include memory resources storing instructions to be executed by a processor.

In some examples, a phase of the multi-phase converter operation may be carrying an amount of power that is disproportionate when compared to the remaining phases of the multi-phase converter operation, this may indicate that the phase is damaged or otherwise not operating correctly. When a phase is damaged or otherwise not operating as instructed by the controller included on the server, a larger than intended amount of power may be consumed by the affected power phase. This situation may result in damage to the devices receiving power from the multi-phase converter operation, costly downtime, and may conceal the root cause of the phase failure thus preventing a correction for future operations. As used herein, the term "root cause" means the origin of malfunction. As used herein, the term "downtime", means a system, component, a service or similar operation is not working at a given time. A downtime may be planned, or a downtime may be unplanned in response to faulty or damaged equipment or components. As used herein, the term "fault" refers to an operation that may be indicative of a malfunction. An unplanned downtime event may result in the loss of data, time, and/or productivity.

In some examples, the damaged phase may be reporting a lower than expected electrical power. For example, the controller may instruct each phase of a 3-phase operation to each carry 40 amps. In this example, if one phase is damaged, it may deliver higher or lower than expected electrical power to the load. This may result in damage to the devices and/or a failure of the computing system resulting in unplanned downtime. Further, the root cause of the defect may not be apparent when a load disparity results in the failure of computing components.

In some examples described herein, the controller may designate an amount of power to be supplied to a device by each phase of a multi-phase converter operation. In this example, the controller may monitor the amount of electrical power carried by each phase of the multi-phase converter operation to manage the amount of power being supplied to the devices and to detect an electrical power disparity between the phases. As used herein, the term "monitor" means the controller may observe the amount of power carried by each phase to check that each phase is operating correctly by carrying the amount of power originally designated by the controller. In some examples, the controller may set an electrical power threshold for a total amount of power to be distributed between each phase of the multi-phase converter operation. As described by way of example herein, the electrical power threshold may change based on the phases operating in the multi-phase converter operation and the device(s) receiving power. The controller may set an electrical power threshold and monitor each phase to check for a load disparity between the phases.

For example, during a multi-phase converter operation, the controller may compare the current output (Iout) of each phase of the multi-phase converter operation to the expected average Iout given the number of phases included in the multi-phase converter operation and the electrical power threshold established by the controller. When the controller detects a load disparity on a phase that persists for a determined period of time, the controller can disable the phase exhibiting the load disparity. In this manner, the system may avoid an unplanned shutdown or damage by disabling a phase from operation that is suspected to be damaged. Further, the controller may disable the phase without interrupting the other operations of the computing device. After the suspected damaged phase has been disabled from operation, the controller may set a new electrical power threshold and redistribute the electrical power among the remaining phases. As used herein, the term "redistribute" means, to divide and/or allocate an amount of electrical power between each phase of a multi-phase converter operation, sometimes for a second or more occasion.

As described herein, by monitoring the Iout of each phase and comparing it to an expected average, the controller may detect a load disparity and protect a computing system from damage or unplanned downtime. The controller may disable the suspected faulty phase from operation and send an alert to a user. In this way, the user may have additional time to move data loads to another computing device, therefore protecting data from an unplanned shut down or damage. Additionally, by monitoring the Iout and comparing it to an expected average Iout, the controller may isolate the suspected faulty phase while allowing the multi-phase converter operation to continue to operate. In this way, the multi-phase converter operation may continue to power the device(s) on the computing device.

The figures herein follow a numbering convention in which the first digit corresponds to the drawing figure number and the remaining digits identify an element or component in the drawing. Elements shown in the various figures herein may be capable of being added, exchanged, and/or eliminated so as to provide a number of additional examples of the present disclosure. In addition, the proportion and the relative scale of the elements provided in the figures are intended to illustrate the examples of the present disclosure and should not be taken in a limiting sense.

FIG. 1 illustrates an example controller 100 connected in a multi-phase converter operation consistent with the present disclosure. As illustrated in FIG. 1, a controller 100 is connected to a multi-phase converter operation including a plurality of phases 112-1, . . . , 112-N that are providing power 114 to a device 116. While one device 116 is illustrated in FIG. 1, in some examples of the present disclosure more than one device may be provided power. As used herein, the plurality of phases 112-1, . . . , 112-N may be collectively referred to as phases 112. As illustrated in FIG. 1, each of the phases 112 may be connected to the controller 100 via a power monitor 108 and a pulse width modulator signal 110. The controller 100 may include a memory resource 102, which may store resources that include instructions executable by a processing resource 104. The memory 102 may also include a register 106 to store information related to the phases of the multi-phase converter operation. Although the following descriptions refer to a single processing resource, a single register, and a single memory resource, the descriptions may also apply to a system with multiple processing resources, multiple registers, and multiple memories. In such examples, the instructions may be distributed (e.g., stored) across multiple memories and the instructions may be distributed (e.g., executed by) across multiple processing resources.

The memory resource 102 may be volatile memory (e.g., RAM, DRAM, SRAM, EPROM, EEPROM, etc.) and/or non-volatile memory (e.g., a HDD, a storage volume, data storage, etc.). The processing resource 104 may be a central processing unit (CPU), a semiconductor-based microprocessor, and/or other hardware devices suitable for retrieval and execution of instructions stored in non-transitory computer readable medium. The processing resource 104 may fetch, decode, and execute instructions, and as an alternative or in addition to retrieving and executing instructions, the processing resource 104 may include at least one electronic circuit that includes electronic components for performing a functionality of instructions as described herein.

As illustrated in FIG. 1, the controller 100 may set an electrical power threshold. As used herein, the term "electrical power threshold" means an amount of power (e.g., voltage and/or current), that may be distributed substantially equally amongst the plurality of phases 112. For example, the electrical power threshold may be set based on the electric power capacity of the phases 112, where the controller 100 may set an electrical power threshold that is below the capacity of the phases 112 such that the phases 112 may continue to operate if a particular phase (e.g., phase 112-1) is disabled from operation and power is redistributed. The electrical power threshold may be changed depending the number of phases in operation, the amount of power utilized by the device 116, and other similar considerations. As used herein, the term "substantially" intends that the characteristic does not have to be absolute but is close enough so as to achieve the characteristic. For example, "substantially equal" is not limited to absolute uniformity. In some examples, the controller 100 may compare the power output (Iout) of the individual phases to the expected average Iout of the multi-phase converter operation.

For example, the controller 100 may calculate an expected average Iout by summing the individual Iout reported from each of the phases 112 and dividing that number by the total number of operational phases in the multi-phase converter operation. The controller 100 may compare the Iout of an individual phase 112-1 to the expected average Iout. Continuing with the previous example, the controller 100 may compare the individual phase 112-1 Iout to the expected average Iout to check for a load disparity between the phases 112 of the multi-phase converter operation. As used herein, the term "load disparity" means, a variation in the amount of electrical power carried (e.g., reported) by a phase in a multi-phase converter operation that is outside of an allowed variation for a determined amount of clock cycles. As used herein, the term "outside" means that the allowed variation of electrical power is below or above a determined amount by an unacceptable margin. For example, the controller 100 may determine that it is unacceptable for a phase 112 to be reporting an amount of electrical power that is outside 20 percent of the expected average Iout, thus the acceptable range for the individual phase Iout may be 10 percent above or below the expected average Iout. Correspondingly, as used herein, the term "inside" means that the individual phase 112-1 is reporting an acceptable Iout, thus within 10 percent above or below the expected average Iout. Continuing with the previous example, as used herein the term "clock cycle" means, a constant frequency of which computing operations may take place, (e.g. a duty cycle, or a portion thereof). For example, the controller 100 may determine that when a phase is outside of an allowed variation for 5 clock cycles, the phase is considered be suspected to be faulty. Although the examples herein may refer to specific amounts of power and percentages of allowed variation it should be understood that the numbers given are by way of example, and not be interpreted in a limiting sense.

In some examples, the controller 100 may compare the individual phase Iout reporting to an allowed variation stored in the register 106. For example, the controller 100 may utilize the expected average Iout to determine the allowed variation determined acceptable for an individual phase Iout. Further, the controller 100 may determine an acceptable number of clock cycles and store this in a second register similar to register 106. For a specific example, in a 6-phase (e.g., 112-1, . . . 112-N) multi-phase converter operation, the processing resource 104 may execute instructions that calculate the expected average Iout per individual phase to be 33.33 amps per phase. In this example, the controller 100 may have determined that the allowed variation may be 20 percent, for 5 clock cycles. Therefore, if an individual phase 112-1 reports an Iout that is substantially outside (e.g., 10 percent above or below 33.33 amps) for 5 clock cycles, the phase 112-1 may be suspected to be faulty and disabled from the multi-phase converter operation. Therefore, should any of the individual phases 112-1, . . . 112-N report an amount of electric power that is substantially larger than 37 amps (or less than 30 amps) for longer than 5 clock cycles, the controller 100 may respond by disabling the suspected phase from operation in the multi-phase converter operation.

For example, when the controller 100 monitors the phases 112 via the current monitor 108, and the controller 100 detects an amount of electrical power that is different than the amount of power reported by the remaining phases 112 of the multi-phase converter operation (e.g., detects a load disparity) the processing resource 104 may respond by transmitting an alarm. Further, the processing resource 104 may record and store information related to the phases 112 in a register similar to register 106. Such information may include, the specific phase, the time, the clock cycle, the device(s) being powered by the multi-phase converter system, the expected average Iout, the allowed variation, the individual Iout of the phases, etc. This stored information may assist in determining the root cause of the particular phase 112-1 operating outside the allowed variation, thereby preventing future disruption. In some examples, the processing resource 104 may execute instructions to disable the particular phase 112-1 from the multi-phase converter operation.

As used herein, the term "disable" or "disable the phase", means that the suspected faulty phase 112-1 may be prevented from delivering electrical power to the device(s) 116. For example, the processing resource 104 may execute instructions to discontinue the operation of the pulse width modulator signal (PWM) 110-1 corresponding to the particular phase 112-1. In this preceding example, the controller 104 may be protecting a computing system from failure, unscheduled downtime, and/or protecting device(s) 116 from damage by disabling the suspected faulty phase 112-1 from operating on the multi-phase converter operation. In some examples, the processing resource 104 of the controller 100 may set a new electrical power threshold and redistribute the electrical power between the remaining phases 112-N of the multi-phase converter operation.

For example, after the processing resource 104 of the controller 100 may execute instructions to disable the particular phase 112-1 from the multi-phase converter operation, and the processing resource 104 may execute instructions to redistribute the electrical power substantially evenly between remaining phases of the multi-phase converter operation. In this example, the remaining phases of the multi-phase converter operation may continue to operate without interruption when the suspected faulty phase 112-1 is disabled from the multi-phase converter operation. The processing resource 104 of the controller 100 may calculate a new expected average Iout in the same manner described above, except in this example, there is one less phase operating in the multi-phase converter operation. Continuing with this example, the electrical power that was carried by the now disabled phase 112-1, will be redistributed to the remaining operational phases of the multi-phase converter operation, thus the remaining phases 112-N will be carrying a larger electrical power than they were before the suspected faulty phase 112-1 was disabled from operation. Consequently, a new allowable variation may be set by the controller 100.

In some examples, the controller 100 may set a new allowable variation smaller than the first because the remaining phases are now carrying a larger electrical power that may be closer to the electric power capacity of the remaining phases. For example, as described in the examples above, if the first allowable variation was 20 percent, the second allowable variation may be 15 percent. In this way, the controller may be alerted to another suspected faulty phase when the multi-phase converter system experiences a load disparity.

In the preceding examples described in conjunction with FIG. 1, the controller 100 may operate to take pre-active protection by detecting a phase operating with a load disparity, therefore indicating a suspected faulty phase operating in a multi-phase converter operation and disabling it before it can damage the device(s) or the system on which the multi-phases are operating. Further, the preceding examples, describe an alarm to allow a user valuable time to take remedial action to move data and/or device etc. to a different power source.

Figure 2:
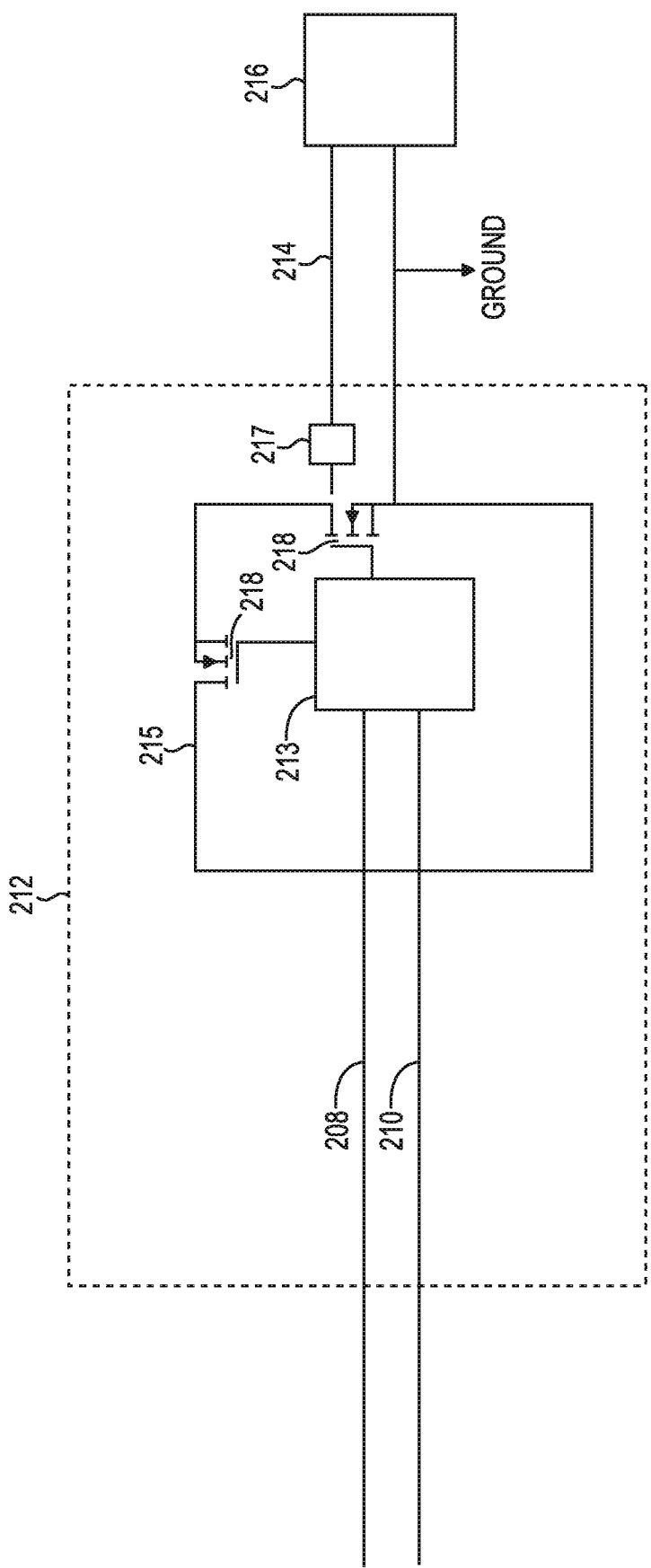
FIG. 2 illustrates an example phase with an integrated power stage consistent with the present disclosure.

FIG. 2 illustrates an example phase with an integrated power stage consistent with the present disclosure. FIG. 2 illustrates a phase 212 including a current monitor 208 and a pulse width modulator signal (PWM) 210 that are connected to a driver 213 that may be included within the phase 212. As used herein, the term "driver" means an electrical circuit and/or another electrical component that is used to control another electrical component. For example, the driver 213 may be included in the phase 212 to regulate the current flowing through the circuitry of the phase 212. As illustrated in FIG. 2, the driver 213 may be included as a component of an integrated power stage 215. As used herein, the term "integrated power stage" means an integrated circuit and/or a monolithic integrated circuit that may control one or more switches, collectively referred to as the switches 218. The phase 212 may be part of circuit operating as a voltage regulator to provide a stable DC voltage (e.g., voltage 214) to the device 216. The phase 212 may also include a voltage filter 217. As used herein, the term "voltage filter" means a DC averaging circuit that may be connected to each phase. While one phase 212 and one device 216 are illustrated in FIG. 2, more phases and/or devices may be present in some examples.

As illustrated in FIG. 2, the driver 213 may be integrated into the integrated power stage 215 to regulate power allocated to the phase 212. In some incidences, an amount of power that is outside the allowed variation may be supplied as a voltage 214 to the device 216. In this case, the phase 212 may be driven to failure causing unplanned downtime and alternatively or in addition to damaging the device 216. These actions may result in costly repairs, lost data, and damaged equipment. Further, the driver 213, the integrated power stage 215, the switches 218, and the phase 212 may be damaged such that the root cause of the detected load disparity may not be identified as to prevent future phase faults. To prevent such events as previously described, the current monitor 208 may monitor the power supplied using the driver 213.

In some examples, the current monitor 208 may monitor the current provided to the device 216 to a controller (e.g., the controller 100). For example, when the driver 213 is regulating an amount of electrical power, where the electrical power is outside an allowed variation of power as described in examples above, the current monitor 208 may report the electrical power to the controller. The controller may identify the load disparity and identify the phase 212 as suspected to be faulty and disable it from operation. Additionally, the controller may store data from the driver 213 about the regulated power including the individual Iout of the phase 212, the clock cycle, etc. In this way, the potentially damaged phase 212 may be disabled before the multi-phase converter operation experiences unplanned downtime and/or the devices 216 is damaged.

In the preceding examples described in conjunction with FIG. 2, the current monitor 208 monitors the power regulated by the driver 213, and the controller determines that the phase 212 is suspected to be faulty. In this way, the controller may identify the load disparity and take actions such as, generating an alarm and/or a warning to alert a user that there is a failure in the multi-phase converter operation. This may allow a user to schedule downtime to identify the root of the defect and move data and/or devices to another location, prior to damage occurring.

Figure 3:
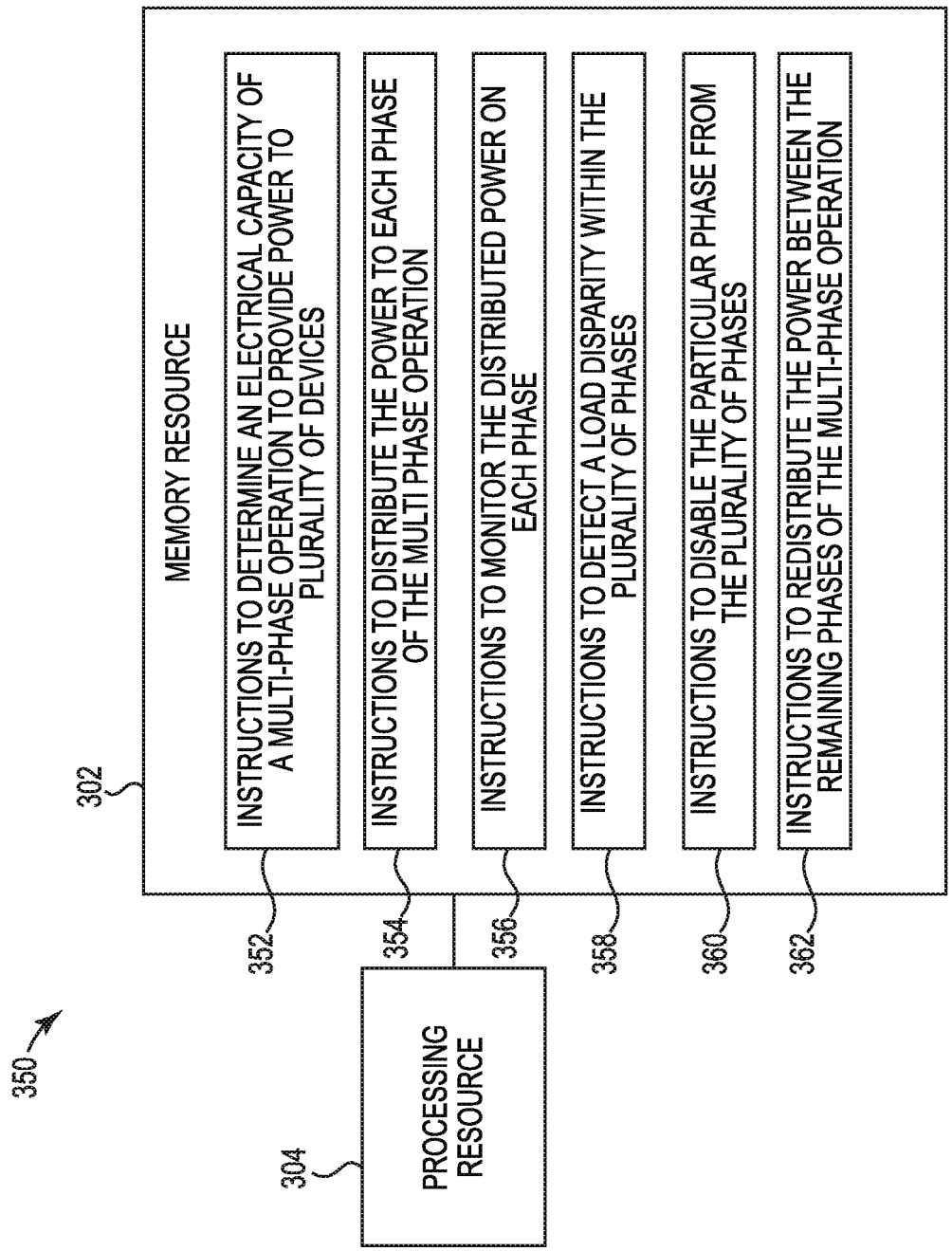
FIG. 3 illustrates an example processing resource and an example memory resource of an example apparatus including a controller consistent with the present disclosure.

FIG. 3 illustrates an example apparatus 350 for load disparity detection consistent with the present disclosure. FIG. 3 illustrates an example processing resource 304 and an example memory resource 302 of an example apparatus 350 including controller (e.g., controller 100). As illustrated in FIG. 3, the apparatus 350 includes a processing resource 304 and a memory resource 302. The processing resource 304 may be a hardware processing unit such as a microprocessor, application specific instruction set processor, coprocessor, network processor, or similar hardware circuitry that may cause machine-readable instructions to be executed. In some examples, the processing resource 304 may be a plurality of hardware processing units that may cause machine-readable instructions to be executed. The processing resource 304 may include central processing units (CPUs) among other types of processing units. The memory resource 302 may be any type of volatile or non-volatile memory or storage, such as random-access memory (RAM), flash memory, read-only memory (ROM), storage volumes, a hard disk, or a combination thereof.

The memory resource 302 may store instructions thereon, such as instructions 352, 354, 356, 358,360, and 362. When executed by the processing resource 304, the instructions may cause the apparatus 350 to perform specific tasks and/or functions. For example, the memory resource 302 may store instructions 352 which may be executed by the processing resource 304 to cause the apparatus 350 to determine an electrical capacity of a multi-phase converter operation which may be providing power to a plurality of devices (e.g., the devices 116). In this example, the processing resource may determine a capacity for each of the phases of the multi-phase converter operation such that when summed together a total capacity of the multi-phase converter operation may be determined, and the processing resource may set the electrical power threshold based on the determined electrical capacity of the multi-phase converter operation. For instance, a multi-phase converter operation including 6-phases each with a capacity of 50 amps, has a multi-phase converter operation capacity of 300 amps. Accordingly, the processing resource of the controller may allocate up to 50 amps to each phase. However, as described above, the phases may be allocated additional amounts of electrical power in the event that a particular phase is disabled from the multi-phase converter operation and power is redistributed. Thus, the electrical power threshold may be set such that each phase carries an amount of electrical power that is below the capacity corresponding to each phase.

Continuing with the example above, the controller may set an electrical power threshold of 200 amps to reserve capacity on each phase of the multi-phase converter operation. For example, the memory resource 302 may store instructions 354 which may be executed by the processing resource 304 to cause the apparatus 350 to distribute the 200 amps between the 6-phases; therefore, each phase may carry 33.33 amps. The distribution from the instructions executed at 354 is conducted such that each phase receives an amount of allocated power that is substantially equal to the other phases of the multi-phase converter operation. The controller may calculate the expected average Iout by summing the individual Iout reported from each of the phases and dividing that number by the total number of phases in the multi-phase converter operation. For example, in the specific example above, the controller may expect an Iout of 33.33 amps per phase of the multi-phase converter operation. This expected average Iout may be stored in a register included in the controller. The registers in the controller may also store the percent allowed variation, and the set amount of clock cycles.

Continuing with the previous example, assume that the stored percent allowed variation is 20 percent, and the stored amount of clock cycles is set at 5. For example, the memory resource 302 may store instructions 356 which may be executed by the processing resource 304 to cause the apparatus 350 to cause a current monitor (e.g., current monitor 108) to monitor the individual Iout reported for each phase of the multi-phase converter operation. Responsive to the current monitor corresponding to a particular phase and detecting a reported Iout that is outside the 20 percent allowed variation for greater than 5 clock cycles, the current monitor may report a load disparity to the controller. Further, the controller may store the data relating to the event such as the current reported by the particular phase, the percent allowed variation, the clock cycles, the device(s) powered etc. Continuing with this example, in response to the controller receiving this information from the current monitor, the controller may detect the load disparity.

Continuing with the previous example, the memory resource 302 may store instructions 358 which may be executed by the processing resource 304 to cause the apparatus 350 to detect, by the controller, the load disparity between the particular phase and the remaining phases of the multi-phase converter operation. The detection by the controller of the load disparity may indicate that the particular phase is faulty, and the controller may generate a warning and/or an alarm to alert a user and/or a system manager such that preventative action may be taken to preserve data and to protect the devices(s) powered by the multi-phase converter operation.

Continuing with the previous example, the controller may take preventative action to protect the device(s) powered by the multi-phase converter operation. For example, the memory resource 302 may store instructions 360 which may be executed by the processing resource 304 to cause the apparatus 350 to instruct the controller to disable the particular phase from the plurality of phases making up the multi-phase converter operation. For example, the processing resource may execute instructions to discontinue the operation of the pulse width modulator signal (e.g., the PWM 110) that corresponds to the particular phase. In this preceding example, the controller may be protecting a computing system from failure, unscheduled downtime, and/or protecting device(s) from damage by disabling the suspected faulty particular phase from operating on the multi-phase converter operation. The multi-phase converter operation may avoid unscheduled downtime in this example as the remaining plurality of phases of the multi-phase converter operation may continue to operate while the particular phase is disabled by the controller. To continue with this example, the Iout from the now disabled particular phase may be redistributed to the remaining phases of the multi-phase converter operation.

For example, the memory resource 302 may store instructions 362 which may be executed by the processing resource 304 to cause the apparatus 350 to instruct the controller to redistribute the power between the remaining phases of the multi-phase converter operation. For instance, referring back to the example above, 6 phases in operation carrying 33.33 amps, becomes 5 phases in operation, with each of the remaining phases of the multi-phase converter operation carrying 40 amps. As stated previously, in this example, the capacity of each phase is 50 amps. In some examples, the controller may set a new percent of allowed variation such that the controller is alerted before the remaining phases reach their respective capacity. Alternatively, or additionally, the controller may set a new electrical power threshold based on the determined electrical capacity of the multi-phase converter operation and the number of phases of the plurality of phases remaining in operation. When the new electrical power threshold is set, and the electrical power is redistributed, the multi-phase converter operation may return to the operations load disparity detection operations described by FIG. 3, where a second particular phase may be identified and disabled from operation, and so on.

In the preceding examples described in conjunction with FIG. 3, the current monitor is monitoring the power and the controller determines that a particular phase is suspected to be faulty. In this way, the controller may identify the load disparity and take actions such as generate an alarm and/or a warning to alert a user that there is a failure in the multi-phase converter operation. This may allow a user to schedule downtime to identify the root of the defect and move data and/or devices to another location, prior to damage occurring. Further, the controller may operate to take pre-active protection by detecting the particular phase operating with a load disparity, therefore indicating a suspected faulty phase operating in a multi-phase converter operation and disabling it before it can damage the device(s) or the system on which the multi-phases are operating.

Figure 4:
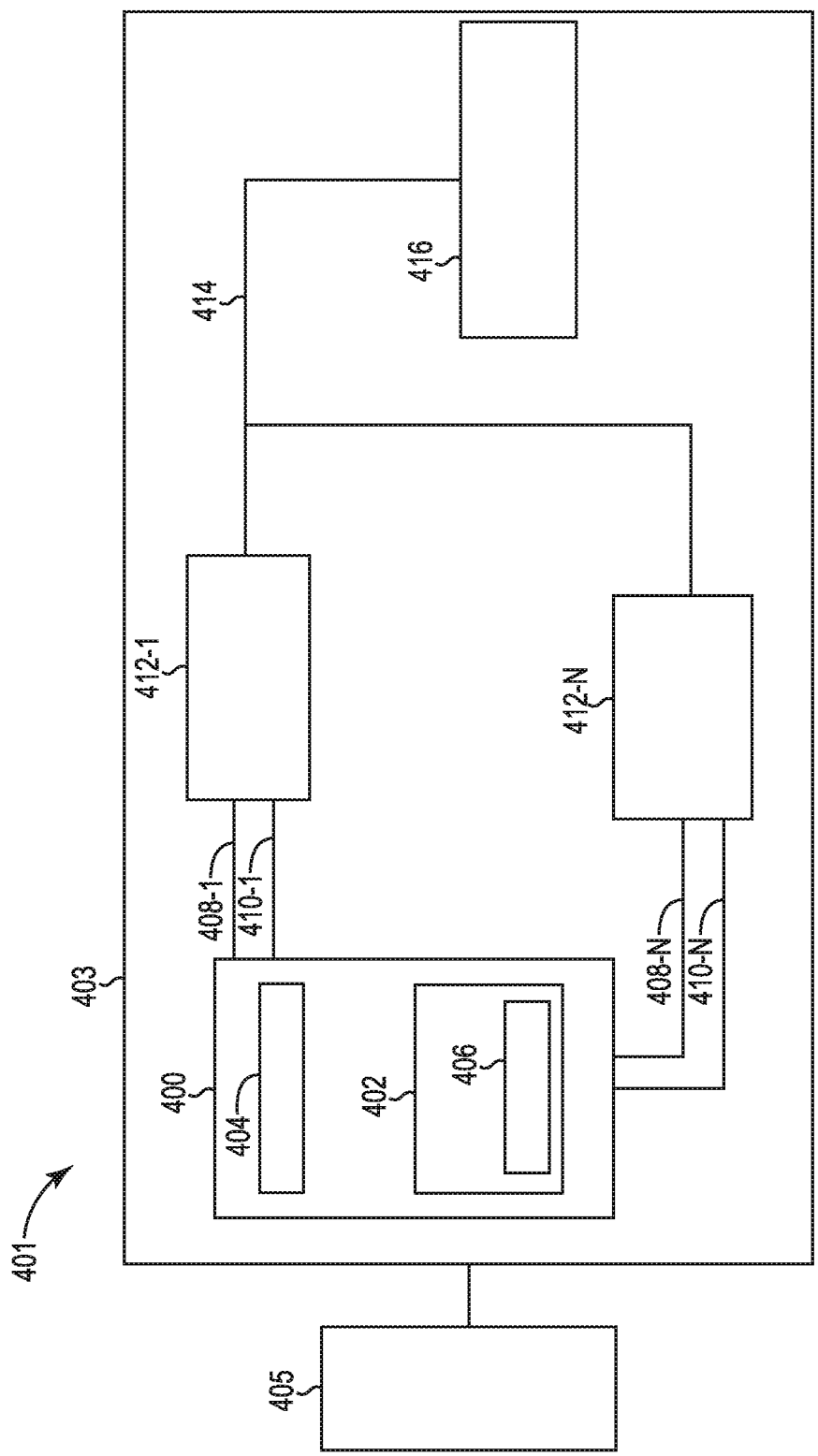
FIG. 4 illustrates an example multi-phase converter system consistent with the present disclosure.

FIG. 4 illustrates an example multi-phase converter system consistent with the present disclosure. As illustrated in FIG. 4 the system 401 includes a power source 405 to provide an amount of electrical power to a computing system 403 such that the power source 405 can provide power to the computing system 403. As used herein, the term "power source" means a supply of power in the form of electrical energy. In some examples, the power source may facilitate the transfer of electric power from area to a device, and in other examples the power source may be a reservoir of power (e.g., a battery) to supply power to the computing system. The system 401 includes a multi-phase converter operation to provide power to a plurality of devices 416.

As illustrated in FIG. 4, the controller 400 may set a first electrical power threshold to be distributed to a plurality of phases 412. For example, when the first electrical power threshold is 200 amps it may be distributed between the plurality of phases 412 (e.g., a 6-phases operation); therefore, each phase may carry 33.33 amps. The distribution of the first electrical power threshold is conducted such that each phase of the plurality of phases 412 receives an amount of allocated power that is substantially equal to the other phases of the multi-phase converter operation. The processing resource 404 may execute instructions to monitor the individual Iout of the plurality of phases 412 to monitor that they are not outside a percent allowed variation, for longer than a set amount of clock cycles.

For example, the set clock cycles and the percent allowed variation are stored in registers 406. In this example, assume that the stored percent allowed variation is 20 percent, and the stored amount of clock cycles is set at 5. The current monitor 408-1 may monitor the individual Iout reported for phase 412-1 of the multi-phase converter operation within the computing system 403. Responsive to the current monitor 408-1 corresponding to the particular phase 412-1 detecting a reported Iout that is outside the 20 percent allowed variation for greater than 5 clock cycles, the current monitor 408-1 may report a load disparity to the controller 400. Further, the controller 400 may store the data relating to the event such as the current reported by the particular phase 412-1, the percent allowed variation, the clock cycles, the device(s) powered etc. Continuing with this example, in response to the controller 400 receiving this information from the current monitor 408-1, the controller 400 may detect the load disparity.

Continuing with the previous example, the controller 400 may detect the load disparity between the particular phase 412-1 and the remaining phases of the multi-phase converter operation 412-N. The detection by the controller 400 of the load disparity may indicate that the particular phase 412-1 is faulty, and the controller 400 may generate a warning and/or an alarm to alert a user and/or a system manager such that preventative action may be taken to preserve data and to protect the devices(s) powered by the multi-phase converter operation. In this example, the controller 400 may take such preventative action as to disable the particular phase 412-1 from operating in the multi-phase converter operation.

Since the particular phase 412-1 has been disabled, the processing resource may execute instructions for the controller 400 to redistribute the power between the remaining phases of the plurality of phases 412 operating in the multi-phase converter operation. Referring back to the example above, there were 6 phases in operation each carrying 33.33 amps. There are now 5 phases operating, and each of the remaining phases of the multi-phase converter operation carries 40 amps. In some examples, the controller 400 may set a new percent of allowed variation such that the controller 400 is alerted before the remaining phases 412-N reach their respective capacity. Alternatively, or additionally, the controller 400 may set a second electrical power threshold based on the determined electrical capacity of the multi-phase converter operation and the number of phases 412-N of the plurality of phases 412 remaining in operation, and the electrical power may be substantially distributed to the remaining phases based on the second electrical power threshold.

In the preceding examples described in conjunction with FIG. 4, the current monitor 408-1 is monitoring the power reported by a particular phase 412-1 and the controller 400 determines that the particular phase 412-1 is suspected to be faulty. In this way, the controller 400 may identify the load disparity and take actions such as generate an alarm and/or a warning to alert a user that there is a failure in the multi-phase converter operation and the computing system 403 may be at risk of damage. This may allow a user to schedule downtime for the computing system 403 to identify the root of the defect and move data and/or devices 416 to another location, prior to damage occurring. Further, the controller 400 may operate to take pre-active protection by detecting the particular phase 412-1 operating with a load disparity, therefore indicating a suspected faulty phase operating in a multi-phase converter operation and disabling it before it can damage the device(s) 416 or the computing system 403 on which the multi-phases are operating.

The above specification, examples and data provide a description of the method and applications and use of the system and method of the present disclosure. Since many examples can be made without departing from the spirit and scope of the system and method of the present disclosure, this specification merely sets forth some of the many possible example configurations and implementations.

What is claimed:

1. A controller, comprising:
a processing resource; and
a memory resource storing machine-readable instructions executable to cause the processing resource to:
set threshold for total electrical power to be provided by a plurality of phases;
determine an expected output power for each phase of the plurality;
monitor an actual output power provided by each phase of the plurality;
detect a load disparity when the actual output power provided by a particular phase of the plurality of phases is different than the expected output power for the particular phase;
disable the particular phase; and
increase the expected output power and the actual output power of the remaining phases of the plurality to at least partially compensate for a decrease in the total electrical power resulting from the disabling of the particular phase.

2. The controller of claim 1, wherein the processing resource distributes the total electrical power equally between each phase of the plurality of phases.

3. The controller of claim 1, wherein the load disparity indicates that the particular phase has experienced a fault.

4. The controller of claim 1, wherein the actual output power provided by the particular phase before being disabled is less than an average actual output power provided by the remaining phases.

5. The controller of claim 1, wherein the actual output power provided by the particular phase before being disabled is greater than an average actual output power provided by the remaining phases.

6. The controller of claim 1, wherein the total electrical power provided by the remaining phases after disabling the particular phase is less than the determined electrical power capacity of the remaining phases.

7. The controller of claim 1, wherein the actual output power provided by the particular phase before being disabled is outside a determined allowable variation from the expected output power determined for the particular phase.

8. The controller of claim 7, wherein the actual output power provided by the particular phase before being disabled is outside the determined allowable variation for a determined amount of clock cycles.

9. The controller of claim 1, wherein the processing resource is further to set a second threshold for the total electrical power provided by the remaining phases after disabling the particular phase.

10. A non-transitory machine-readable medium storing instructions that, when executed by a processing resource, cause the processing resource to:
determine an electrical capacity of a multi-phase converter operation to provide a threshold amount of power to a plurality of devices;
distribute a fraction of the threshold amount of power to each phase of the multi-phase converter operation;
monitor actual output power provided by each of the phases;
detect a load disparity when the actual output power provided by a particular phase of the multi-phase converter operation is different than an average actual output power provided by the remaining phases of the multi-phase converter operation;
disable the particular phase from the multi-phase converter operation; and
redistribute the threshold amount of power between the remaining phases of the multi-phase converter operation.

11. The medium of claim 10, wherein the remaining phases of the multi-phase converter operation continue to operate after the particular phase is disabled.

12. The medium of claim 10, wherein the processing resource distributes an equal fraction of the threshold amount of power to each operating phase of the multi-phase converter operation.

13. The medium of claim 10, wherein the threshold amount of power is less than the electrical capacity of the multi-phase converter operation.

14. The medium of claim 10, wherein the processing resource increases the power provided by each of the remaining phases of the multi-phase converter operation by an equal amount of the power lost by disabling the particular phase.

15. The medium of claim 10, wherein the processing resource disables the particular phase responsive to the actual output power provided by the particular phase reaching a determined level for a set number of clock cycles.

16. The medium of claim 10, wherein the processing resource is further to transmit an alert to the computing device responsive to detection of the load disparity.

17. A system, comprising:
a computing system; and
a power source to provide electrical power to the computing system, the computing system further comprising:
a plurality of devices powered by the electrical power; and
a controller including a processing resource to execute instructions to cause the controller to:
set a first threshold for a first amount of the electrical power;
distribute the first amount of the electrical power between a plurality of phases;
monitor an actual output power provided by each phase of the plurality;
detect a load disparity responsive to a difference between the actual output power provided by a particular phase of the plurality and an average power provided by other phases of the plurality;
disable the particular phase;
set a second threshold for a second amount of the electrical power; and
distribute the second amount of electrical power between the other phases of the plurality.

18. The system of claim 16, wherein the processing resource executes further instructions to generate an alert indicating the particular phase has been disabled.

19. The system of claim 16, wherein the first threshold is less than a total electrical capacity of the plurality of phases.

20. The system of claim 16, wherein the computing system operates uninterrupted when the particular phase is disabled.

\* \* \* \* \*